(12) United States Patent
Park et al.

(10) Patent No.: US 10,559,746 B2
(45) Date of Patent: Feb. 11, 2020

(54) MAGNETORESISTIVE RANDOM ACCESS MEMORY DEVICES AND METHODS OF MANUFACTURING THE SAME

(71) Applicant: Samsung Electronics Co., Ltd., Suwon-si, Gyeonggi-do (KR)

(72) Inventors: Yong-Sung Park, Suwon-si (KR); Woo-Jin Kim, Yongin-si (KR); Jeong-Heon Park, Hwaseong-si (KR); Se-Chung Oh, Yongin-si (KR); Joon-Myoung Lee, Anyang-si (KR); Hyun Cho, Changwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 2 days.

(21) Appl. No.: 16/108,192

(22) Filed: Aug. 22, 2018

(65) Prior Publication Data
US 2019/0123263 A1    Apr. 25, 2019

(30) Foreign Application Priority Data
Oct. 25, 2017  (KR) .................. 10-2017-0139625

(51) Int. Cl.
*H01L 43/12* (2006.01)
*H01L 43/02* (2006.01)
*H01L 27/22* (2006.01)
*H01L 43/10* (2006.01)

(52) U.S. Cl.
CPC ............ *H01L 43/02* (2013.01); *H01L 27/222* (2013.01); *H01L 27/224* (2013.01); *H01L 27/228* (2013.01); *H01L 43/10* (2013.01); *H01L 43/12* (2013.01)

(58) Field of Classification Search
CPC ..... H01L 27/222; H01L 27/224; H01L 43/02; H01L 43/10; H01L 43/12
See application file for complete search history.

(56) References Cited

U.S. PATENT DOCUMENTS

| 6,347,049 B1* | 2/2002 | Childress .............. B82Y 10/00 257/E27.005 |
| 6,812,537 B2* | 11/2004 | Okazawa ................ G11C 11/15 257/421 |
| 7,479,394 B2 | 1/2009 | Horng et al. |
| 7,488,609 B1 | 2/2009 | Lin et al. |

(Continued)

FOREIGN PATENT DOCUMENTS

| JP | 5840935 B2 | 1/2016 |
| KR | 1020130028684 A | 3/2013 |
| KR | 1020140028757 A | 3/2014 |

*Primary Examiner* — Stephen W Smoot
(74) *Attorney, Agent, or Firm* — Myers Bigel, P.A.

(57) ABSTRACT

The methods of manufacturing an MRAM device and MRAM devices are provided. The methods may include forming a first electrode on an upper surface of a substrate, forming a first magnetic layer on the first electrode, forming a tunnel barrier structure on the first magnetic layer, forming a second magnetic layer on the tunnel barrier structure, and forming a second electrode on the second magnetic layer. The tunnel barrier structure may include a first tunnel barrier layer and a second tunnel barrier layer that are sequentially stacked on the first magnetic layer and may have different resistivity distributions from each other along a horizontal direction that may be parallel to the upper surface of the substrate.

20 Claims, 18 Drawing Sheets

(56) References Cited

U.S. PATENT DOCUMENTS

| | | | | |
|---|---|---|---|---|
| 8,686,484 B2* | 4/2014 | Whig | ................... | H01L 43/08 |
| | | | | 257/295 |
| 9,276,198 B2 | 3/2016 | Lim et al. | | |
| 9,660,187 B1 | 5/2017 | Park et al. | | |
| 10,134,808 B2* | 11/2018 | Kan | ................... | G11C 11/161 |
| 2004/0091744 A1* | 5/2004 | Carey | ................... | B82Y 10/00 |
| | | | | 428/811.1 |
| 2012/0128870 A1* | 5/2012 | Zhao | ................... | H01F 41/307 |
| | | | | 427/130 |
| 2012/0235258 A1 | 9/2012 | Zhao et al. | | |
| 2013/0234266 A1 | 9/2013 | Prejbeanu et al. | | |
| 2015/0207064 A1* | 7/2015 | Lee | ................... | H01L 43/12 |
| | | | | 438/3 |
| 2016/0086645 A1 | 3/2016 | Erickson et al. | | |
| 2016/0111632 A1* | 4/2016 | Sandhu | ................ | H01L 27/222 |
| | | | | 257/421 |
| 2016/0211440 A1 | 7/2016 | Siddik et al. | | |
| 2017/0125669 A1* | 5/2017 | Park | ................... | H01L 43/12 |
| 2017/0294482 A1* | 10/2017 | Hu | ................... | H01L 27/226 |
| 2019/0165262 A1* | 5/2019 | Kim | ................... | H01L 43/12 |

* cited by examiner

MAGNETORESISTIVE RANDOM ACCESS MEMORY DEVICES AND METHODS OF MANUFACTURING THE SAME

CROSS-REFERENCE TO RELATED APPLICATION

This application claims priority under 35 U.S.C. § 119 to Korean Patent Application No. 10-2017-0139625, filed on Oct. 25, 2017, in the Korean Intellectual Property Office (KIPO), the disclosure of which is hereby incorporated by reference herein its entirety.

BACKGROUND

The present disclosure generally relates to the field of electronics and, more particularly, to magnetoresistive random access memory (MRAM) devices and methods of manufacturing the same.

An MRAM device may include a magnetic tunnel junction (MTJ) structure in which a tunnel barrier layer is interposed between magnetic layers, and data may be stored in the MRAM device by using the resistance difference of the MTJ structure according to the spins of the magnetic layers. The tunnel barrier layer having a uniform resistance may be beneficial.

SUMMARY

Example embodiments provide a method of manufacturing an MRAM device having good characteristics.

Example embodiments provide an MRAM device having good characteristics.

According to example embodiments, methods of manufacturing an MRAM device are provided. The methods may include forming a first electrode on an upper surface of a substrate, forming a first magnetic layer on the first electrode, forming a tunnel barrier structure on the first magnetic layer, forming a second magnetic layer on the tunnel barrier structure, and forming a second electrode on the second magnetic layer. The tunnel barrier structure may include a first tunnel barrier layer and a second tunnel barrier layer that are sequentially stacked on the first magnetic layer and may have different resistivity distributions from each other along a horizontal direction that may be parallel to the upper surface of the substrate.

According to example embodiments, methods of manufacturing an MRAM device are provided. The methods may include forming a first electrode on a substrate, forming a first magnetic layer on the first electrode, forming a tunnel barrier structure on the first magnetic layer by an RF sputtering process using a target, forming a second magnetic layer on the tunnel barrier structure, and forming a second electrode on the second magnetic layer. The tunnel barrier structure may include a first tunnel barrier layer and a second tunnel barrier layer that are sequentially stacked on the first magnetic layer. The substrate may be spaced apart from the target by a first distance while forming the first tunnel barrier layer, the substrate may be spaced apart from the target by a second distance while forming the second tunnel barrier layer, and the first distance may be different from the second distance.

According to example embodiments, methods of manufacturing an MRAM device are provided. The methods may include forming a first electrode on a substrate, forming a first magnetic layer on the first electrode, forming a first tunnel barrier layer on the first magnetic layer by a first sputtering deposition process using a first metal oxide target, forming a second tunnel barrier layer on the first tunnel barrier layer by a second sputtering deposition process using a second metal oxide target, forming a second magnetic layer on the second tunnel barrier layer, and forming a second electrode on the second magnetic layer. A majority of oxygen negative ions that are generated from the first metal oxide target may be provided onto a first portion of the substrate. A majority of oxygen negative ions that are generated from the second metal oxide target may be provided onto a second portion of the substrate, which may be different from the first portion.

According to example embodiments, MRAM devices are provided. The MRAM device may include a first electrode on an upper surface of a substrate, a first magnetic layer on the first electrode, a tunnel barrier structure on the first magnetic layer, a second magnetic layer on the tunnel barrier structure, and a second electrode on the second magnetic layer. The tunnel barrier structure may include a first tunnel barrier layer and a second tunnel barrier layer that are sequentially stacked on the first magnetic layer and may have different resistivity distributions from each other along a horizontal direction that may be parallel to the upper surface of the substrate.

A tunnel barrier structure included in an MRAM device in accordance with example embodiments may have a uniform resistivity distribution. Thus, the MRAM device may have improved electrical characteristics.

DETAILED DESCRIPTION

Example embodiments will be more clearly understood from the following detailed description taken in conjunction with the accompanying drawings. Like reference numbers refer to like elements throughout. As used herein the term "and/or" includes any and all combinations of one or more of the associated listed items.

It will be understood that "two processes being performed in-situ" means that the two processes are performed in a single process chamber, and, in some embodiments, a substrate on which the two processes are performed stays in the single chamber throughout the two processes.

It will be also understood that "a resistivity of a portion of a layer" refers an average resistivity of the portion of the layer.

Figure 1:
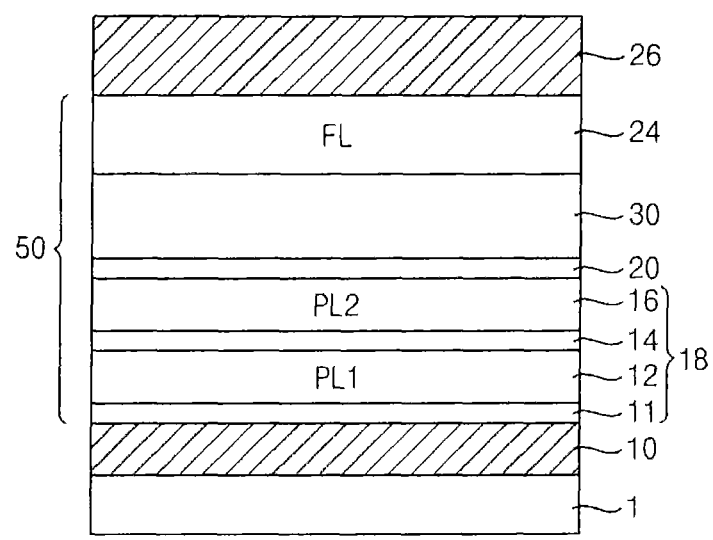
FIG. 1 is a cross-sectional view illustrating an MRAM device in accordance with example embodiments.
Figure 2:
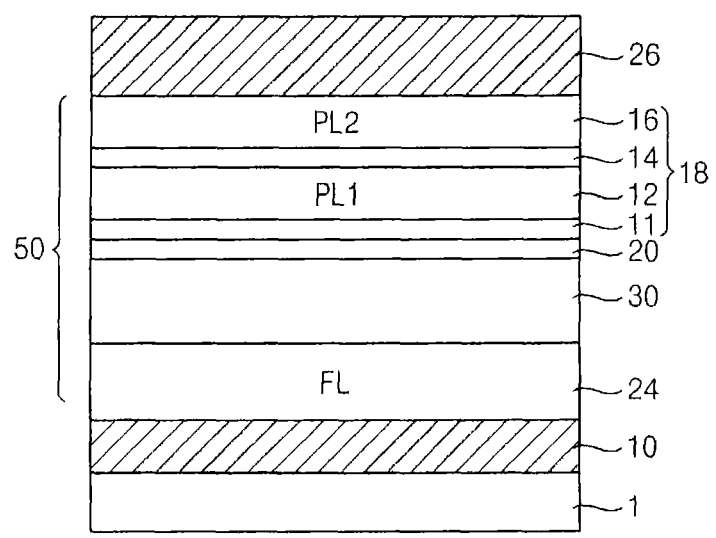
FIG. 2 is a cross-sectional view illustrating an MRAM device in accordance with other example embodiments.

FIG. 1 is a cross-sectional view illustrating an MRAM device in accordance with example embodiments, and FIG. 2 is a cross-sectional view illustrating an MRAM device in accordance with other example embodiments.

Referring to FIG. 1, the MRAM device may include a lower electrode layer 10, an MTJ structure layer 50, and an upper electrode layer 26 sequentially stacked on a substrate 1. The MTJ structure layer 50 may include a seed layer 11, a first pinned layer (PL) 12, a first spacer layer 14, a second PL 16, a polarization enhanced layer 20, a tunnel barrier structure 30, and a free layer (FL) 24 sequentially stacked on a substrate 1.

The substrate 1 may include a semiconductor material, e.g., silicon, germanium, silicon-germanium, or III-V semiconductor compounds (e.g., GaP, GaAs, GaSb), etc. In an example embodiment, the substrate 1 may be a silicon-on-insulator (SOI) substrate or a germanium-on-insulator (GOI) substrate.

Various elements (e.g., word lines, transistors, diodes, source/drain layers, contacts plugs, vias, wirings, etc.) and insulating interlayers on the elements may be formed on the substrate 1.

The lower electrode layer 10 may include a metal, e.g., tungsten, titanium, tantalum, etc., and/or a metal nitride, e.g., tungsten nitride, titanium nitride, tantalum nitride, etc.

The seed layer 11 may serve as a seed such that the first PL 12 of the MTJ structure layer 50 may grow to have a desired crystalline orientation. The seed layer 11 may include a metal, e.g., ruthenium, rhenium, iridium, rhodium, hafnium, etc. In example embodiments, the seed layer 11 may include ruthenium.

The first PL 12 and the second PL 16 may include a ferromagnetic material, e.g., cobalt, platinum, iron, nickel, etc. In some embodiments, the first and second PLs 12 and 16 may include cobalt platinum alloy (CoPt) or a multi-layered structure including a cobalt layer and a platinum layer alternately stacked. The first and second PLs 12 and 16 may include substantially the same material or different materials.

The first spacer layer 14 may include, e.g., a synthetic anti-ferromagnetic (SAF) material. Thus, the first spacer layer 14 may serve as a SAF coupling spacer. The first spacer layer 14 may include, e.g., ruthenium, iridium, rhodium, etc.

A stacked structure including the seed layer 11, the first PL 12, the first spacer layer 14, and the second PL 16 may serve as a fixed layer structure 18. In some embodiments, the fixed layer structure 18 may include a single pinned layer.

The polarization enhanced layer 20 may include a compound, e.g., CoFe, NiFe, FeCr, CoFeNi, PtCr, CoCrPt, CoFeB, NiFeSiB, CoFeSiB, etc. The polarization enhanced layer 20 may enhance the spin tunneling effect. In some embodiments, the MTJ structure layer 50 may include no polarization enhanced layer.

The free layer 24 may include a ferromagnetic material, e.g., cobalt, platinum, iron, nickel, etc. The free layer 24 may further include boron and/or silicon. These may be used alone or in a combination thereof. In some embodiments, the free layer 24 may include a compound, e.g., CoFe, NiFe, FeCr, CoFeNi, PtCr, CoCrPt, CoFeB, NiFeSiB, CoFeSiB, etc.

In some embodiments, the MTJ structure layer 50 may not be limited to the above described stacked structure. FIG. 1 shows that the free layer 24 is disposed over the fixed layer structure 18, however, the inventive concepts are not limited thereto. In some embodiments, the free layer 24 may be disposed under the fixed layer structure 18, as illustrated in FIG. 2.

The tunnel barrier structure 30 may include an insulating metal oxide. Tunnel barrier layers included in the tunnel barrier structure 30 may include the same metal oxide that may be formed under different conditions. In some embodiments, the tunnel barrier layers may include the same metal element (e.g., magnesium and aluminum) and oxide. In some embodiments, each of the tunnel barrier layers may be magnesium oxide and/or aluminum oxide. In some embodiments, the tunnel barrier layers may include magnesium oxide. For example, the tunnel barrier structure 30 may include magnesium oxide and/or aluminum oxide. In some embodiments, the tunnel barrier structure 30 may have a thickness of about 5 Å to about 50 Å.

A tunnel barrier or spin polarization may be generated between the free layer 24 and the second PL 16 by the tunnel barrier structure 30. Thus, the characteristics of the tunnel barrier structure 30 may be important in the electrical characteristics of the MRAM device. For example, a uniform resistivity of the tunnel barrier structure 30 may be beneficial.

In example embodiments, the tunnel barrier structure 30 may be formed on the substrate 1 (e.g., an upper surface of the substrate) by an RF sputtering process using a metal oxide as a target. The tunnel barrier structure 30 may be formed on an upper surface of the substrate 1. The tunnel barrier structure 30 may include portions, which are spaced apart from each other in a horizontal direction that is parallel to the upper surface of the substrate 1. According to the locations of the portions of the tunnel barrier structure 30, resistivities of the portions of the tunnel barrier structure 30 may be changed (e.g., may vary). That is, the uniformity of resistivity of the tunnel barrier structure 30 according to the location thereof on the substrate 1 may not be always good. When the resistivity of the tunnel barrier structure 30 is not uniform across the substrate 1, the electrical characteristics of MRAM devices (e.g., MRAM chips) formed on the same substrate 1 may not be uniform. Accordingly, some of the MRAM devices (e.g., MRAM chips) may not satisfy desired electrical characteristics.

The tunnel barrier structure 30 may have a stacked structure including a plurality of tunnel barrier layers that may be formed under different process conditions. In example embodiments, the tunnel barrier structure 30 may have a stacked structure including a plurality of tunnel barrier layers that may be formed under process conditions to have different resistivity distributions across the substrate 1. Accordingly, the tunnel barrier structure 30 may have the stacked structure including a plurality of tunnel barrier layers that have different resistivity distributions across the substrate 1, respectively, and the tunnel barrier structure 30 may have a uniform resistivity distribution. In some embodiments, the tunnel barrier structure 30 a including plurality of tunnel barrier layers may have a resistivity distribution more uniform than a resistivity distribution of each individual one of the plurality of tunnel barrier layers. In some embodiments, at least two of the plurality of tunnel barrier layers of the tunnel barrier structure 30 may have different resistivity distributions across the substrate 1.

Hereinafter, the tunnel barrier structure 30 in accordance with example embodiments will be explained.

FIGS. 3 to 8 are cross-sectional views illustrating tunnel barrier structures 30 in accordance with example embodiments.

Figure 3:
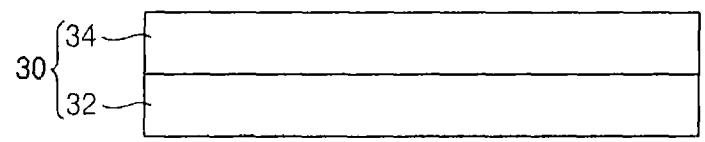
FIGS. 3, 4, 5, 6, 7, and 8 are cross-sectional views illustrating tunnel barrier structures in accordance with example embodiments.
Figure 4:
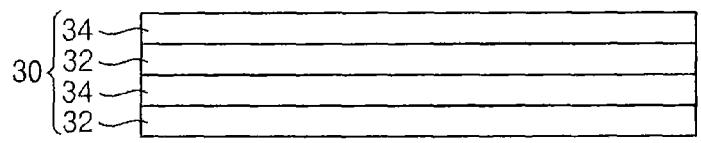

FIGS. 3 and 4 show tunnel barrier structures each of which may include first and second tunnel barrier layers sequentially stacked.

Referring to FIG. 3, the tunnel barrier structure 30 may include a first barrier layer 32 and a second tunnel barrier layer 34 sequentially stacked.

In example embodiments, the first and second tunnel barrier layers 32 and 34 may include magnesium oxide formed by RF sputtering processes. For example, the tunnel barrier structure 30 may include a first magnesium oxide layer and a second magnesium oxide layer. For example, both the first tunnel barrier layer 32 and the second tunnel barrier layer 34 include the same metal (e.g., magnesium).

In example embodiments, the first tunnel barrier layer 32 may have a first resistivity distribution in which a resistivity of a central portion of the first tunnel barrier layer 32 is smaller (i.e., lower) than a resistivity of a ring-shaped portion (i.e., an intermediate portion) of the first tunnel barrier layer 32 that is between the central portion of the first tunnel barrier layer 32 and an edge portion of the first tunnel barrier layer 32. The second tunnel barrier layer 34 may have a second resistivity distribution in which a resistivity of a central portion of the second tunnel barrier layer 34 is greater (i.e., higher) than a resistivity of an edge portion of the second tunnel barrier layer 34.

The tunnel barrier structure 30 may have a thickness of about 5 Å to about 50 Å, but the present inventive concepts are not limited thereto. Each of the first and second tunnel barrier layers 32 and 34 may have an appropriate thickness.

The tunnel barrier structure 30 may have the stacked structure including the first and second tunnel barrier layers 32 and 34 that have different resistivity distributions, and thus the tunnel barrier structure 30 may have a uniform resistivity over all portions thereof.

In some embodiments, the first tunnel barrier layer 32 may have the second resistivity distribution in which a resistivity of a central portion of the first tunnel barrier layer 32 is greater than a resistivity of an edge portion of the first tunnel barrier layer 32, and the second tunnel barrier layer 34 may have the first resistivity distribution in which a resistivity of a central portion of the second tunnel barrier layer 34 is smaller than a resistivity of a ring-shaped portion of the second tunnel barrier layer 34 between the central portion and an edge portion of the second tunnel barrier layer 34.

In some embodiments, the first tunnel barrier layer 32 may have the second resistivity distribution in which a resistivity of a central portion of the first tunnel barrier layer 32 is greater than a resistivity of an edge portion of the first tunnel barrier layer 32, and the second tunnel barrier layer 34 may have a third resistivity distribution in which a resistivity of a central portion of the second tunnel barrier layer 34 is smaller than a resistivity of an edge portion of the second tunnel barrier layer 34.

In some embodiments, the first tunnel barrier layer 32 may have the third resistivity distribution in which a resistivity of a central portion of the first tunnel barrier layer 32 is smaller than a resistivity of an edge portion of the first tunnel barrier layer 32, and the second tunnel barrier layer 34 may have the second resistivity distribution in which a resistivity of a central portion of the second tunnel barrier layer 34 is greater than a resistivity of an edge portion of the second tunnel barrier layer 34.

Referring to FIG. 4, the tunnel barrier structure 30 may have a stacked structure including the first and second tunnel barrier layers 32 and 34 alternately and repeatedly stacked on each other.

Each of a pair of the first and second tunnel barrier layers 32 and 34 may be substantially the same as the pair of the first and second tunnel barrier layers 32 and 34 discussed with reference to FIG. 3.

The tunnel barrier structure 30 may have a thickness of about 5 Å to about 50 Å. Thus, each of the first and second tunnel barrier layers 32 and 34 may have a thickness smaller (i.e., thinner) than that of each of the first and second tunnel barrier layers 32 and 34 of FIG. 3. However, the thickness of each of the first and second tunnel barrier layers 32 and 34 may not be limited.

Figure 5:
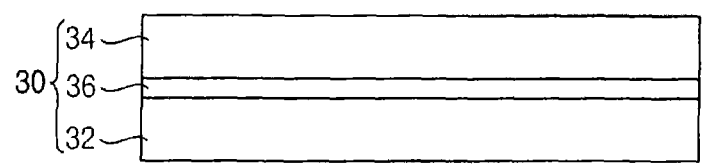
Figure 6:
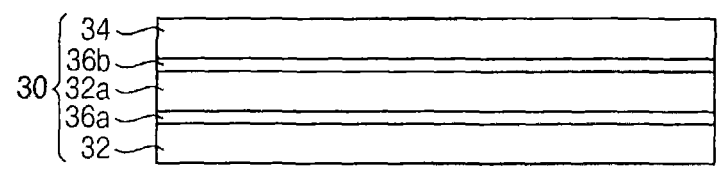

FIGS. 5 and 6 show tunnel barrier structures including a metal layer interposed between tunnel barrier layers.

Referring to FIG. 5, the tunnel barrier structure 30 may include the first tunnel barrier layer 32, a metal layer 36, and a second tunnel barrier layer 34 sequentially stacked.

Each of a pair of the first and second tunnel barrier layers 32 and 34 may be substantially the same as the pair of the first and second tunnel barrier layers 32 and 34 illustrated with reference to FIG. 3.

The metal layer 36 may enhance the tunneling effect of the tunnel barrier structure 30. In some embodiments, a resistivity of the tunnel barrier structure 30 may be reduced by the metal layer 36.

The metal layer 36 may include, e.g., aluminum, magnesium, titanium, tantalum, CoFeB, tungsten, hafnium, gold, silver, iridium, platinum, ruthenium, cobalt, iron, etc.

In example embodiments, the metal layer 36 may include a metal included in the first and second tunnel barrier layers 32 and 34.

The metal layer 36 may have a thickness equal to or less than that of each of the first and second tunnel barrier layers 32 and 34.

In example embodiments, the first and second tunnel barrier layers 32 and 34 may include magnesium oxide formed by, for example, an RF sputtering process. For example, the metal layer 36 may include magnesium formed by an RF sputtering process. For example, the tunnel barrier structure 30 may include a first magnesium oxide layer, a magnesium layer, and a second magnesium oxide layer sequentially stacked.

Referring to FIG. 6, the tunnel barrier structure 30 may have a stacked structure including the first tunnel barrier layer 32, a first metal layer 36a, an additional first tunnel barrier layer 32a, a second metal layer 36b, and the second tunnel barrier layer 34 sequentially stacked.

Each of a pair of the first and second tunnel barrier layers 32 and 34 may be substantially the same as the pair of the first and second tunnel barrier layers 32 and 34 illustrated with reference to FIG. 3.

The first and second metal layers 36a and 36b may include a metal included in the metal layer 36 illustrated with reference to FIG. 5. In some embodiments, the first and second metal layers 36a and 36b may include substantially the same material. In some embodiments, the first and second metal layers 36a and 36b may include different materials.

Figure 7:
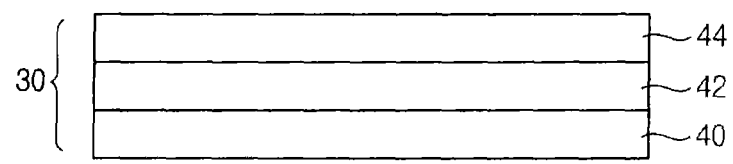
Figure 8:
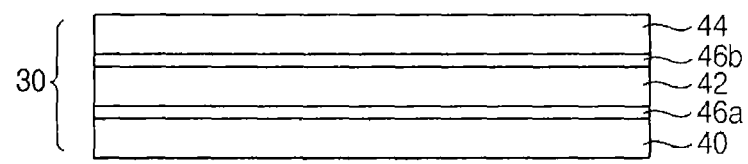

FIGS. 7 and 8 show tunnel barrier structures each of which may include first, second and third tunnel barrier layers sequentially stacked.

Referring to FIG. 7, the tunnel barrier structure 30 may include first, second, and third tunnel barrier layers 40, 42, and 44 sequentially stacked.

In example embodiments, the first tunnel barrier layer 40 may have the first resistivity distribution in which a resistivity of a central portion is smaller than a resistivity of a ring-shaped portion between the central portion and an edge portion. The second tunnel barrier layer 42 may have the second resistivity distribution in which a resistivity of a central portion is greater than a resistivity of an edge portion. The third tunnel barrier layer 44 may have the third resistivity distribution in which a resistivity of a central portion is smaller than a resistivity of an edge portion.

In example embodiments, the locations (e.g., a sequence) of the first to third tunnel barrier layers 40, 42 and 44 may be changed. In some embodiments, the first tunnel barrier layers 40, the third tunnel barrier layer 44, and the second tunnel barrier layer 42 may be sequentially stacked.

In example embodiments, the first to third tunnel barrier layers 40, 42 and 44 may be include magnesium oxide formed by, for example, an RF sputtering.

FIG. 8 shows a tunnel barrier structure 30 including a metal layer interposed between tunnel barrier layers.

Referring to FIG. 8, the tunnel barrier structure 30 may include the first tunnel barrier layer 40, a first metal layer 46a, the second tunnel barrier layer 42, a second metal layer 46b, and the third tunnel barrier layer 44 sequentially stacked.

The first to third tunnel barrier layers 40, 42 and 44 may be substantially the same as those illustrated with reference to FIG. 7. The first and second metal layers 46a and 46b may include a metal of the metal layer 36 illustrated with reference to FIG. 5. In some embodiments, the first and second metal layers 46a and 46b may include substantially the same material. In some embodiments, the first and second metal layers 46a and 46b may include different materials.

In example embodiments, the first to third tunnel barrier layers 40, 42 and 44 may include magnesium oxide formed by an RF sputtering process. The first and second metal layers 46a and 46b may include magnesium formed by an RF sputtering process. For example, the tunnel barrier structure may include a first magnesium oxide layer, a first magnesium layer, a second magnesium oxide layer, a second magnesium layer, and a third magnesium oxide layer sequentially stacked.

Figure 9:
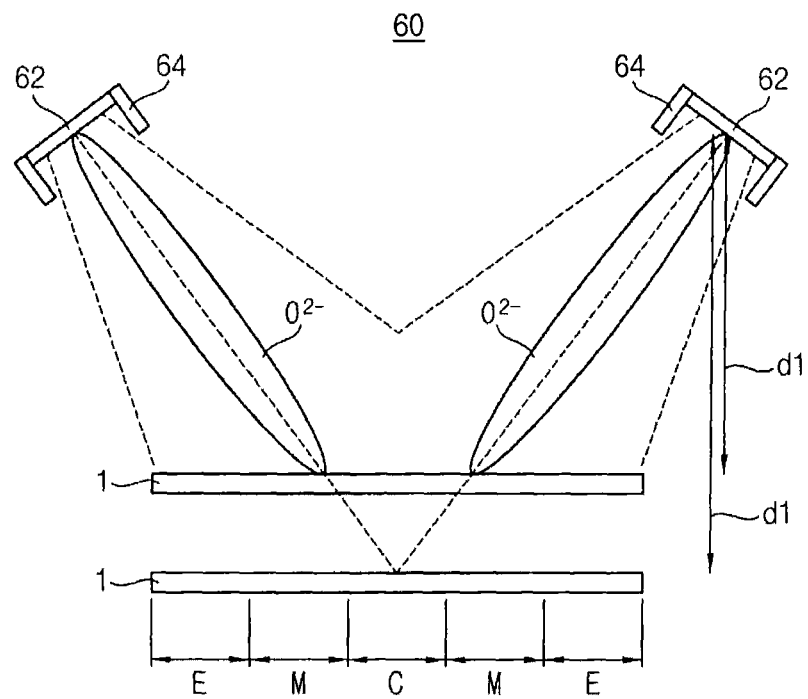
FIG. 9 shows an RF sputtering apparatus for forming tunnel barrier structures in accordance with example embodiments.
Figure 10:
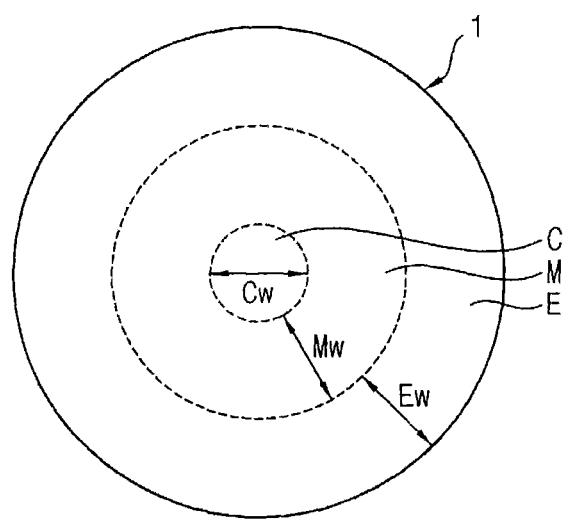
FIG. 10 shows a substrate on which the tunnel barrier structures may be formed.

FIG. 9 shows an RF sputtering apparatus for forming tunnel barrier structures in accordance with example embodiments. FIG. 10 shows a substrate on which the tunnel barrier structures are formed.

Referring to FIGS. 9 and 10, an RF sputtering apparatus 60 may include a target 62 that may be transformed into a tunnel barrier layer (e.g., the first tunnel barrier layer 32, and the second tunnel barrier layer 34). The target 62 may include a metal oxide, for example, magnesium oxide. A guide 64 may surround the target 62. The guide 64 may guide a sputtering direction of the target 62. In example embodiments, one or a plurality of targets 62 may be disposed in the RF sputtering apparatus 60.

The substrate 1 includes a central portion C, an edge portion E that is spaced apart from the central portion C in a horizontal direction that is parallel to an upper surface of the substrate, and a ring-shaped portion M between the central portion C and the edge portion E. In some embodiments, the central portion C, the ring-shaped portion M, and the edge portion E may be arranged along the horizontal direction, as illustrated in FIG. 10. It will be understood that the ring-shaped portion M can be referred to as an intermediate portion. The central portion C may have a first width Cw, the ring-shaped portion M may have a second width Mw, and the edge portion may have a third width Ew. In some embodiments, the first width Cw, the second width Mw, and the third width Ew may be equal, as illustrated in FIGS. 9 and 10.

For example, when two targets 62 are disposed in a process chamber of the RF sputtering apparatus 60, each of the two targets 62 may be disposed over an edge portion of the substrate 1 and may face an upper surface of the substrate 1 with an inclined angle, as illustrated in FIG. 9. When one target 62 is disposed in the RF sputtering apparatus 60, the target 62 may face the upper surface of the substrate 1 so that a surface of the target 62 and the upper surface of the substrate 1 may be parallel to each other.

The RF sputtering apparatus 60 may include a gas inlet for a sputtering gas and an RF power supply. The sputtering gas may include, for example, argon gas. The RF sputtering apparatus 60 may further include a loading part on which the substrate 1 may be loaded. The substrate 1 may rotate on the loading part of the RF sputtering apparatus 60 while performing a sputtering process.

The sputtering gas may collide with the target 62, and plasma generated from the target 62 may move radially and downwardly so that a tunnel barrier layer including a metal oxide may be formed on the substrate 1. The distance between the target 62 and the substrate 1 may be important for the deposition characteristics of a layer formed.

In some embodiments, a tunnel barrier layer may be formed by an RF sputtering process, and metal ions, metal oxide ions, oxygen ions may exist (e.g., may be formed) in the process chamber. Oxygen negative ions may have a relatively high energy and may be provided onto a given (e.g., predetermined) portion of the substrate 1. Paths that oxygen negative ions that are generated from the target 62 mainly travel (e.g., a majority of oxygen negative ions generated from the target 62 travel) are illustrated as long ovals in FIG. 9. For example, the oxygen negative ions may be provided from (e.g., be generated from) a central portion of the target 62 onto the substrate 1 to collide with the substrate 1. In some embodiment, a majority of the oxygen negative ions that are generated from the target 62 may be provided onto (e.g., may reach) a specific portion (e.g., predetermined portion) of the substrate 1.

In some embodiments, a portion of the tunnel barrier layer into which the oxygen negative ions are mainly provided (e.g., a majority of the oxygen negative ions that are generated from the target 62) may have a relatively high resistivity than other portions thereof. In some embodiments, a portion of a layer into which the oxygen negative ions are mainly provided refers to the portion of the layer into which a majority of (e.g., not less than 50%, from about 50% to about 100%, about 50%, about 60%, about 70%, about 80%, and about 90%) the oxygen negative ions that are generated from the target 62 are provided. In some embodiments, a resistivity of a portion of the tunnel barrier layer may be proportional to an amount (e.g., concentration) of oxygen negative ions that are provided into the portion of the tunnel barrier layer. Thus, according to the locations of portions of the tunnel barrier layer on the substrate 1, the tunnel barrier layer may have a non-uniform resistivity.

According to a distance dl between the target 62 and the substrate 1, the portion of the substrate 1 onto which the oxygen negative ions may be mainly provided may be changed, as illustrated in FIG. 9. Thus, the resistivity distribution of the tunnel barrier layer may be changed according to the distance dl between the target 62 and the substrate 1.

As shown in FIG. 9, when the distance dl between the target 62 and the substrate 1 increases, the oxygen negative ions from the target 62 may be provided onto a central portion C of the substrate 1 more than an edge portion E of the substrate 1. Thus, the tunnel barrier layer may have a resistivity distribution in which a resistivity of the central portion C is greater than a resistivity of the edge portion E.

When the distance dl between the target 62 and the substrate 1 decreases, the oxygen negative ions from the target 62 may be provided onto a ring-shaped portion M between the central portion C and the edge portion E of the substrate 1 more than an central portion of the substrate 1. Thus, the tunnel barrier layer may have a resistivity distribution in which a resistivity of the ring-shaped portion M between the central portion C and the edge portion E of the substrate 1 is greater than a resistivity of the central portion C.

Likewise, the resistivity distribution of the tunnel barrier layer may be controlled by changing the distance dl between the target 62 and the substrate 1.

Hereinafter, methods of forming tunnel barrier structures in accordance with example embodiments will be illustrated.

Figure 11A:
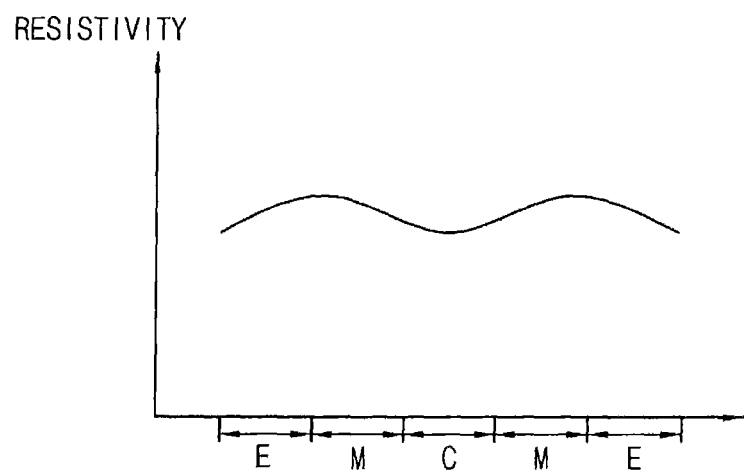
FIGS. 11A, 11B and 11C show resistivity distributions for tunnel barrier structures in accordance with example embodiments.
Figure 11B:
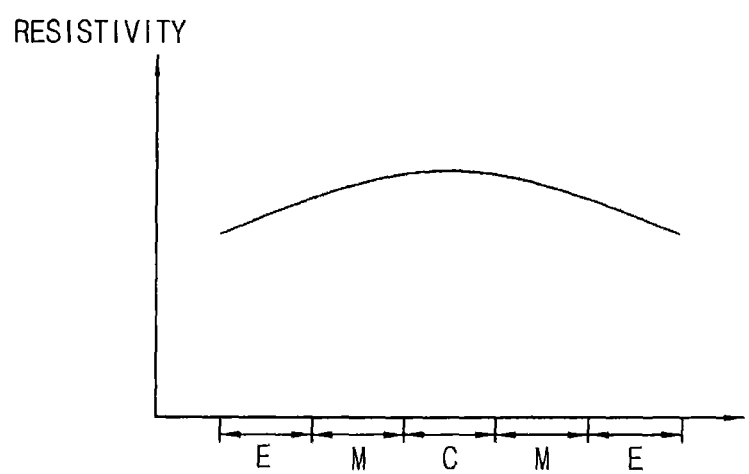
Figure 11C:
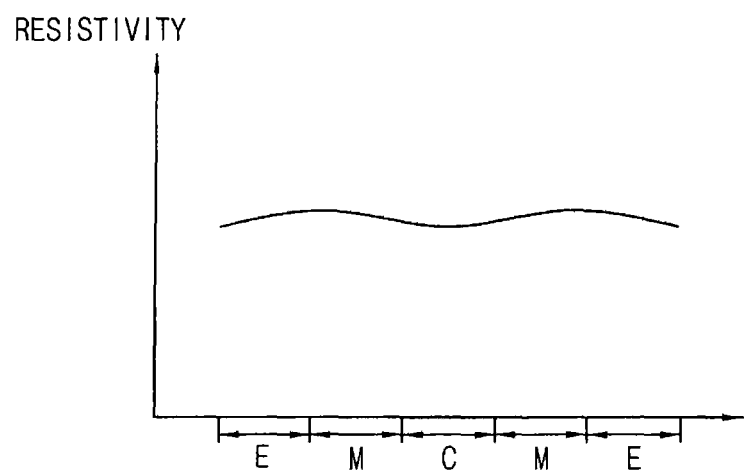

FIGS. 11A, 11B and 11C show resistivity distributions of tunnel barrier structures in accordance with example embodiments.

As illustrated above, the tunnel barrier structures may be formed by an RF sputtering process.

Methods of forming the tunnel barrier structures 30 of FIGS. 3 and 4 will be illustrated with reference to FIGS. 11A, 11B and 11C.

Referring to FIG. 11A and FIG. 3, a first tunnel barrier layer 32 may be formed on a substrate 1. The first tunnel barrier layer 32 may be formed under a first process condition so that the first tunnel barrier layer 32 may have a first resistivity distribution in which a resistivity of a central portion of the first tunnel barrier layer 32 may be smaller (e.g., lower) than a resistivity of a ring-shaped portion (e.g., an intermediate portion) of the first tunnel barrier layer 32 that is between the central portion of the first tunnel barrier layer 32 and an edge portion of the of the first tunnel barrier layer 32, as illustrated in FIG. 11A. The first process condition may include a first distance between a target and the substrate 1, and a power of about 50 W to about 1000 W. In example embodiments, the power may be in a range of about 200 W to about 300 W. It will be understood that, in some embodiments, the central portion of the first tunnel barrier layer 32 may be formed on and may overlap the central portion C of the substrate 1, the ring-shaped portion of the first tunnel barrier layer 32 may be formed on and may overlap the ring-shaped portion M of the substrate 1, and the edge portion of the first tunnel barrier layer 32 may be formed on and may overlap the edge portion E of the substrate 1.

Referring to FIG. 11B and FIG. 3, a second tunnel barrier layer 34 may be formed in-situ on the first tunnel barrier layer 32. For example, forming the first tunnel barrier layer 32 and the forming the second tunnel barrier layer 34 are performed in-situ. The second tunnel barrier layer 34 may be formed under a second process condition so that the second tunnel barrier layer 34 may have a second resistivity distribution in which a resistivity of a central portion of the second tunnel barrier layer 34 may be greater (i.e., higher) than a resistivity of an edge portion of the second tunnel barrier layer 34, as illustrated in FIG. 11B. The second process condition may include a second distance between the target and the substrate 1, which may be greater than the first distance, and a power of about 50 W to about 1000 W. In example embodiments, the power may be in a range of about 200 W to about 300 W. It will be understood that, in some embodiments, the central portion of the second tunnel barrier layer 34 may be formed on and may overlap the central portion C of the substrate 1, the ring-shaped portion of the second tunnel barrier layer 34 may be formed on and may overlap the ring-shaped portion M of the substrate 1, and the edge portion of the second tunnel barrier layer 34 may be formed on and may overlap the edge portion E of the substrate 1.

In example embodiments, after forming the second tunnel barrier layer 34, a heat treatment process may be further performed.

The tunnel barrier structure 30 of FIG. 3 may be formed by the above processes. The tunnel barrier structure 30 may have a uniform resistivity distribution as shown in FIG. 11C. In some embodiments, a tunnel barrier structure including two tunnel barrier layers sequentially stacked may have a resistivity distribution (e.g., the resistivity distribution of FIG. 11C) more uniform than a resistivity distribution of an individual one of the two tunnel barrier layers (e.g., the resistivity distribution of FIG. 11A or FIG. 11B).

The tunnel barrier structure of FIG. 4 may be formed by performing additional processes described below.

In example embodiments, an additional first tunnel barrier layer 32 may be formed on the second tunnel barrier layer 34 that has been already formed under the first process condition, and then an additional second tunnel barrier layer 34 may be formed under the second process condition. After forming the additional second tunnel barrier layer 34, a heat treatment process may be further performed.

Accordingly, the tunnel barrier structure 30 of FIG. 4 may be formed. The tunnel barrier structure 30 may have a uniform resistivity distribution as shown in FIG. 11C.

Methods of forming the tunnel barrier structures 30 of FIGS. 5 and 6 will be illustrated with reference to FIGS. 11A, 11B and 11C.

Referring to FIG. 11A and FIG. 5, the first tunnel barrier layer 32 may be formed on the substrate 1 under the first process condition so that the first tunnel barrier layer 32 may have the first resistivity distribution (e.g., the resistivity distribution of FIG. 11A). A metal layer 36 may be formed on the first tunnel barrier layer 32. The metal layer 36 may be formed by an RF sputtering process. The tunnel barrier layer 32 and the metal layer 36 may be formed in-situ.

Referring to FIG. 11B and FIG. 5, the second tunnel barrier layer 34 may be formed on the metal layer 36 under the second process condition so that the second tunnel barrier layer 34 may have the second resistivity distribution (e.g., the resistivity distribution of FIG. 11B). In example embodiments, after forming the second tunnel barrier layer 34, a heat treatment process may be further performed. Accordingly, the tunnel barrier structure 30 of FIG. 5 may be formed. The tunnel barrier structure 30 may have a uniform resistivity distribution as shown in FIG. 11C.

The tunnel barrier structure 30 of FIG. 6 may be formed by performing processes described below.

In example embodiments, a first tunnel barrier layer 32, a first metal layer 36a, an additional first tunnel barrier layer 32a, a second metal layer 36b, and a second tunnel barrier layer 34 may be sequentially formed. The first tunnel barrier layer 32 and the additional first tunnel barrier layer 32a may be formed under the first process condition and may have the first resistivity distribution (e.g., the resistivity distribution of FIG. 11A), and the second tunnel barrier layer 34 may be formed under the second process condition and may have the second resistivity distribution (e.g., the resistivity distribution of FIG. 11B). A heat treatment process may be further performed after forming the second tunnel barrier layer 34. Accordingly, the tunnel barrier structure 30 of FIG. 6 may be formed. The tunnel barrier structure 30 may have a uniform resistivity distribution as shown in FIG. 11C.

Figure 12A:
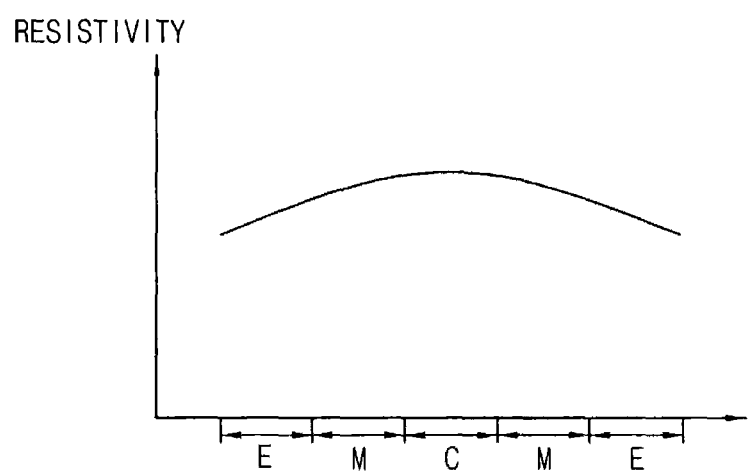
FIGS. 12A, 12B and 12C show resistivity distributions of tunnel barrier structures in accordance with example embodiments.
Figure 12B:
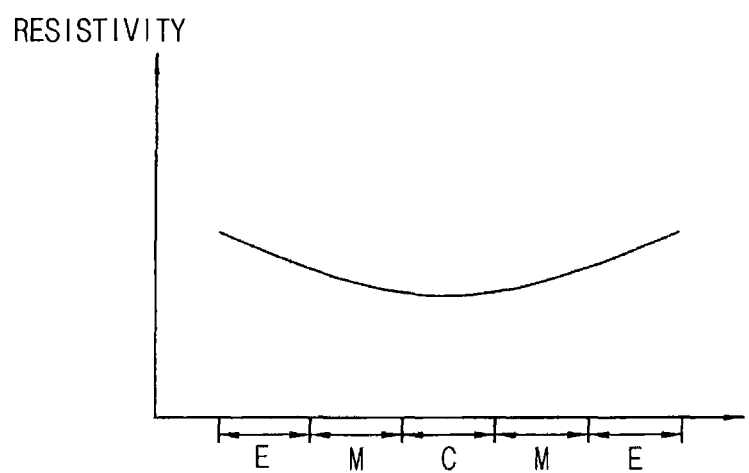
Figure 12C:
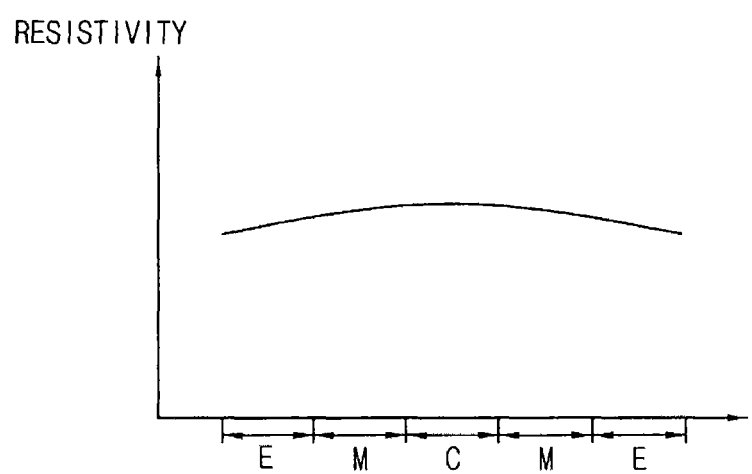

FIGS. 12A, 12B, and 12C show resistivity distributions of tunnel barrier structures in accordance with example embodiments.

Methods of forming the tunnel barrier structures 30 of FIGS. 3 and 4 will be illustrated with reference to FIGS. 12A, 12B, and 12C.

Referring to FIG. 12A and FIG. 3, the first tunnel barrier layer 32 may be formed on the substrate 1. The first tunnel barrier layer 32 may be formed under the second process condition so that the first tunnel barrier layer 32 may have the second resistivity distribution in which a resistivity of a central portion of the first tunnel barrier layer 32 may be greater than a resistivity of an edge portion of the first tunnel barrier layer 32, as shown in FIG. 12A. The second process condition may include the second distance between a target and the substrate 1 and a power of about 50 W to about 1000 W. In example embodiments, the power may be in a range of about 200 W to about 300 W.

Referring to FIG. 12B and FIG. 3, the second tunnel barrier layer 34 may be formed in-situ on the first tunnel barrier layer 32. The second tunnel barrier layer 34 may be formed under a third process condition so that the second tunnel barrier layer 34 may have a third resistivity distribution in which a resistivity of a central portion of the second tunnel barrier layer 34 may be smaller than a resistivity of an edge portion of the second tunnel barrier layer 34, as shown in FIG. 12B. The third process condition may include a third distance between a target and the substrate 1, which may be smaller than the second distance and a power of about 50 W to about 1000 W. In example embodiments, the power may be in a range of about 200 W to about 300 W.

In example embodiments, after forming the second tunnel barrier layer 34, a heat treatment process may be further performed. Thus, the tunnel barrier structure 30 of FIG. 3 may be formed by the above processes. The tunnel barrier structure 30 may have a uniform resistivity distribution as shown in FIG. 12C.

In example embodiments, an additional first tunnel barrier layer 32 may be formed on the second tunnel barrier layer 34 that has been already formed under the second process condition, and then an additional second tunnel barrier layer 34 may be formed under the third process condition. Accordingly, the tunnel barrier structure 30 of FIG. 4 may be formed.

Methods of forming the tunnel barrier structures of FIGS. 5 and 6 will be illustrated with reference to FIGS. 12A, 12B, and 12C.

Referring to FIG. 12A and FIG. 5, the first tunnel barrier layer 32 may be formed on the substrate 1 under the second process condition so that the first tunnel barrier layer 32 may have the second resistivity distribution (e.g., the resistivity distribution of FIG. 12A). The metal layer 36 may be formed in-situ on the first tunnel barrier layer 32.

Referring to FIG. 12B and FIG. 5, the second tunnel barrier layer 34 may be formed on the metal layer 36 under the third process condition so that the second tunnel barrier layer 34 may have the third resistivity distribution (e.g., the resistivity distribution of FIG. 12B). In example embodiments, after forming the second tunnel barrier layer 34, a heat treatment process may be further performed. Accordingly, the tunnel barrier structure 30 of FIG. 5 may be formed. The tunnel barrier structure 30 may have a uniform resistivity distribution as shown in FIG. 12C.

Referring again to FIG. 6, in example embodiments, the first tunnel barrier layer 36a, the additional first tunnel barrier layer 32a, the second metal layer 36b, and the second tunnel barrier layer 34 may be sequentially formed on the first tunnel barrier layer 32 that may be formed under the second process condition. In some embodiments, the additional first tunnel barrier layer 32a may be formed under the second process condition, and the second tunnel barrier layer 34 may be formed under the third process condition. A heat treatment process may be further performed after the second tunnel barrier layer 34 is formed.

Figure 13A:
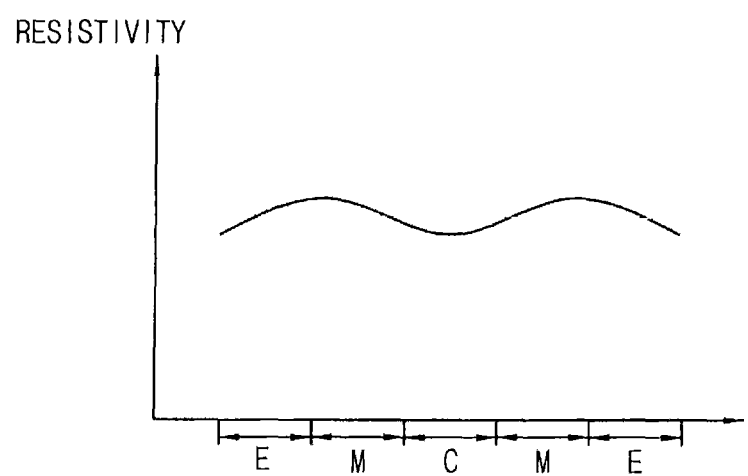
FIGS. 13A, 13B and 13C show resistivity distributions of tunnel barrier structures in accordance with example embodiments.
Figure 13B:
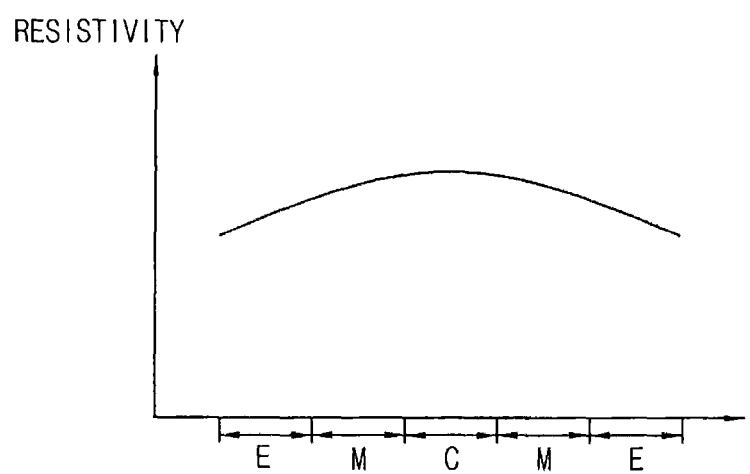
Figure 13C:
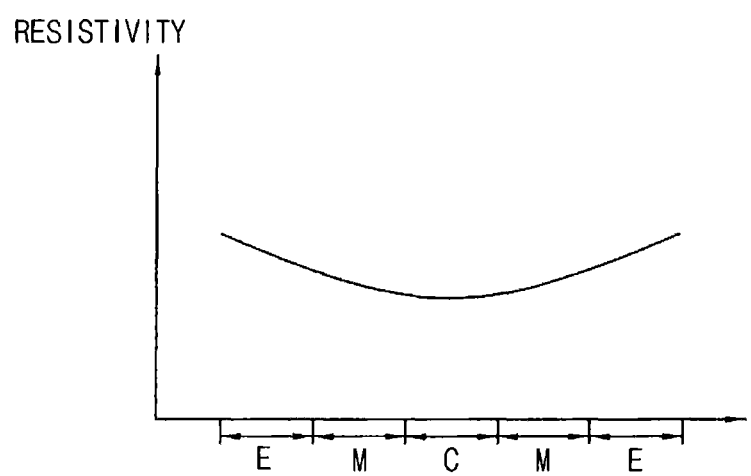

FIGS. 13A, 13B and 13C show resistivity distributions of tunnel barrier structures in accordance with example embodiments.

A method of forming the tunnel barrier structure 30 of FIG. 7 will be illustrated with reference to FIGS. 13A, 13B and 13C.

Referring to FIG. 13A and FIG. 7, a first tunnel barrier layer 40 may be formed on the substrate 1 under the first process condition so that the first tunnel barrier layer 40 may have the first resistivity distribution shown in FIG. 13A.

Referring to FIG. 13B and FIG. 7, a second tunnel barrier layer 42 may be formed on the first tunnel barrier layer 40 under the second process condition so that the second tunnel barrier layer 42 may have the second resistivity distribution shown in FIG. 13B.

Referring to FIG. 13C and FIG. 7, a third tunnel barrier layer 44 may be formed on the second tunnel barrier layer 42 under the third process condition so that the third tunnel barrier layer 44 may have the third resistivity distribution shown in FIG. 13C. Thus, the tunnel barrier structure 30 of FIG. 7 may be formed.

A method of forming the tunnel barrier structure 30 of FIG. 8 will be illustrated with reference to FIGS. 13A, 13B, and 13C.

Referring to FIG. 13A and FIG. 8, the first tunnel barrier layer 40 may be formed on the substrate 1 under the first process condition so that the first tunnel barrier layer 40 may have the first resistivity distribution shown in FIG. 13A. A first metal layer 46a may be formed in-situ on the first tunnel barrier layer 40.

Referring to FIG. 13B and FIG. 8, the second tunnel barrier layer 42 may be formed on the first metal layer 46a under the second process condition so that the second tunnel barrier layer 42 may have the second resistivity distribution shown in FIG. 13B. A second metal layer 46b may be formed in-situ on the second tunnel barrier layer 42.

Referring to FIG. 13C and FIG. 8, the third tunnel barrier layer 44 may be formed on the second metal layer 46b under the third process condition so that the third tunnel barrier layer 44 may have the third resistivity distribution shown in FIG. 13C. Thus, the tunnel barrier structure of FIG. 8 may be formed.

A method of manufacturing an MARM device including the above-illustrated tunnel barrier structures will be illustrated.

FIGS. 14 to 22 are cross-sectional views illustrating a method of manufacturing an MARM device in accordance with example embodiments.

Figure 14:
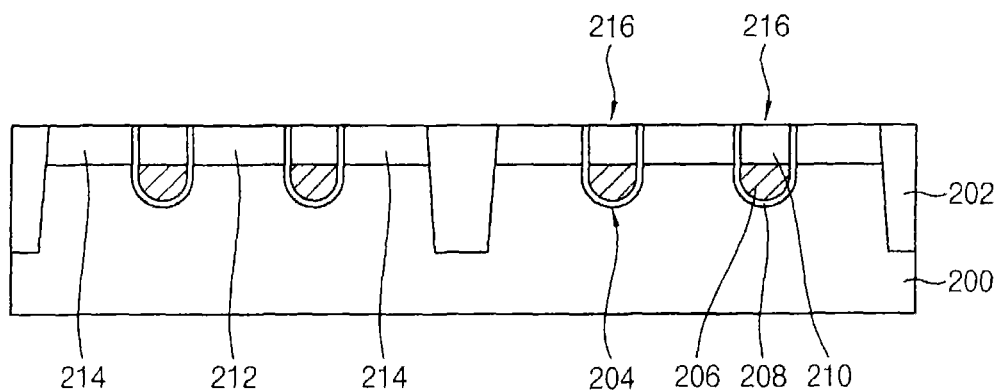
FIGS. 14 to 22 are cross-sectional views illustrating a method of manufacturing an MARM device in accordance with example embodiments.

Referring to FIG. 14, an isolation layer 202 may be formed on a substrate 200 so that the substrate 200 may include an active region and a field region. The isolation layer 202 may be formed by, for example, a shallow trench isolation (STI) process. In example embodiments, a plurality of active regions having an island shape may be formed.

Transistors 216 may be formed on the substrate 200.

In example embodiments, an etching mask may be formed on the substrate 200, the substrate 200 may be etched using the etching mask to form a trench 204 extending in a first direction. In example embodiments, two trenches 204 may be formed on one active region. A gate structure including a gate insulation pattern 208, a gate electrode 206, and a hard mask 210 sequentially stacked may be formed in the trench 204. Impurities may be implanted into an upper portion of the active region of the substrate 200 adjacent the gate structure to form a source region 212 and a drain region 214. The source region 212 may serve as a common source for two neighboring transistors 216.

Figure 15:
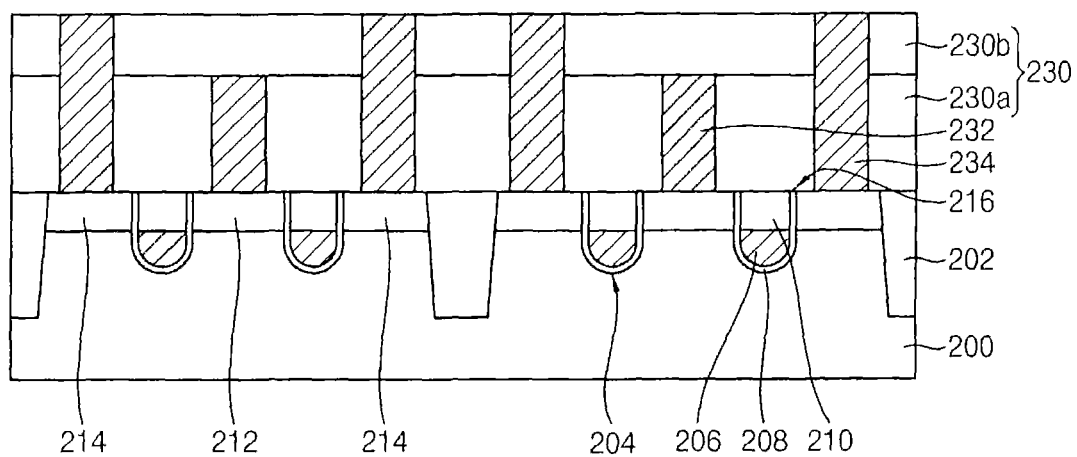

Referring to FIG. 15, a first lower insulating interlayer 230a may be formed on the substrate 200. A portion of the lower insulating interlayer 230a may be etched to form first holes exposing upper surfaces of the source regions 212, respectively. A first conductive layer may be formed in the first holes and planarized to form source lines 232 contacting the source regions 212, respectively.

A second lower insulating interlayer 230b may be formed on the first lower insulating interlayer 230a and the source lines 232. Thus, a lower insulating interlayer structure 230 including the first and second lower insulating interlayers 230a and 230b may be formed.

Second holes may be formed through the lower insulating interlayer structure 230 to expose the drain regions 214, respectively. A second conductive layer may be formed in the second holes and planarized to form contact plugs 234 contacting the drain regions 214, respectively.

Figure 16:
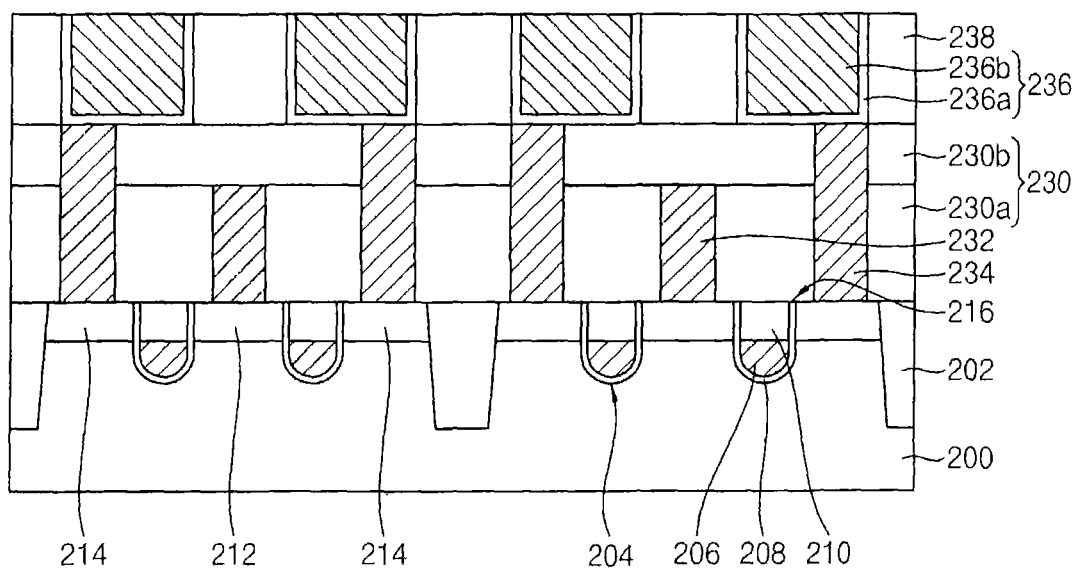

Referring to FIG. 16, a first insulating interlayer 238 may be formed on the lower insulating interlayer structure 230, and a first wiring structure 236 may be formed through the first insulating interlayer 238 to contact the contact plug 234. The first wiring structure 236 may include a first barrier pattern 236a and a first conductive pattern 236b.

In example embodiments, the first wiring structure 236 may be formed by a dual damascene process or a single damascene process. In this case, the first conductive pattern 236b of the first wiring structure 236 may include metal (e.g., copper).

In some embodiments, the first wiring structure 236 may be formed by an etching process. In this case, the first conductive pattern 236b of the first wiring structure 236 may include metal (e.g., tungsten, aluminum, etc).

Figure 17:
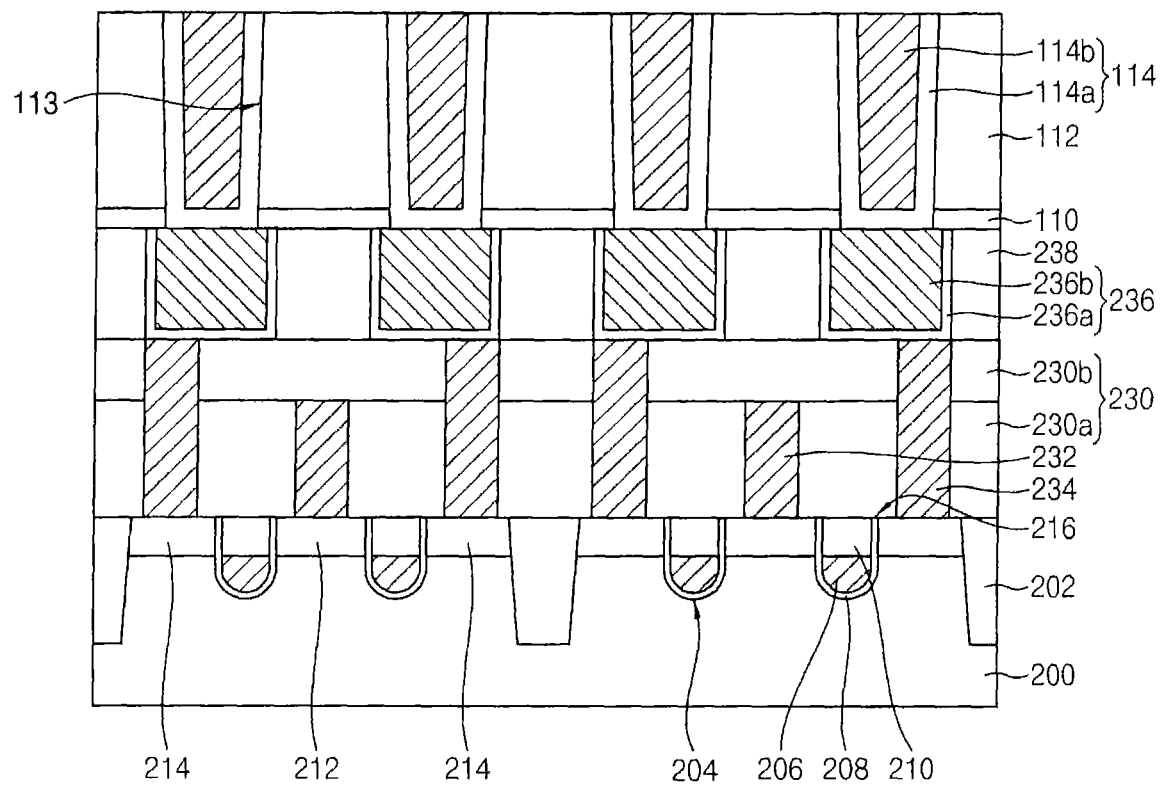

Referring to FIG. 17, an etch stop layer 110, a second insulating interlayer 112, and a lower electrode contact plug 114 may be formed on the first insulating interlayer 238 and the first wiring 236.

The etch stop layer 110 may be formed by, e.g., chemical vapor deposition (CVD) process, or an atomic layer deposition (ALD) process. The second insulating interlayer 112 may be formed by, e.g., a CVD process, an ALD process, or a spin coating process.

The second insulating interlayer 112 and the etch stop layer 110 may be partially etched to form a first opening 113 exposing an upper surface of the first wiring structure 236. A second barrier layer and a second conductive layer may be formed in the first opening 113. The second conductive layer and the second barrier layer may be planarized until an upper surface of the second insulating interlayer 112 may be exposed to form a second conductive pattern 114b and a second barrier pattern 114a, respectively. The second conductive pattern 114b and the second barrier pattern 114a may form the lower electrode contact plug 114.

Figure 18:
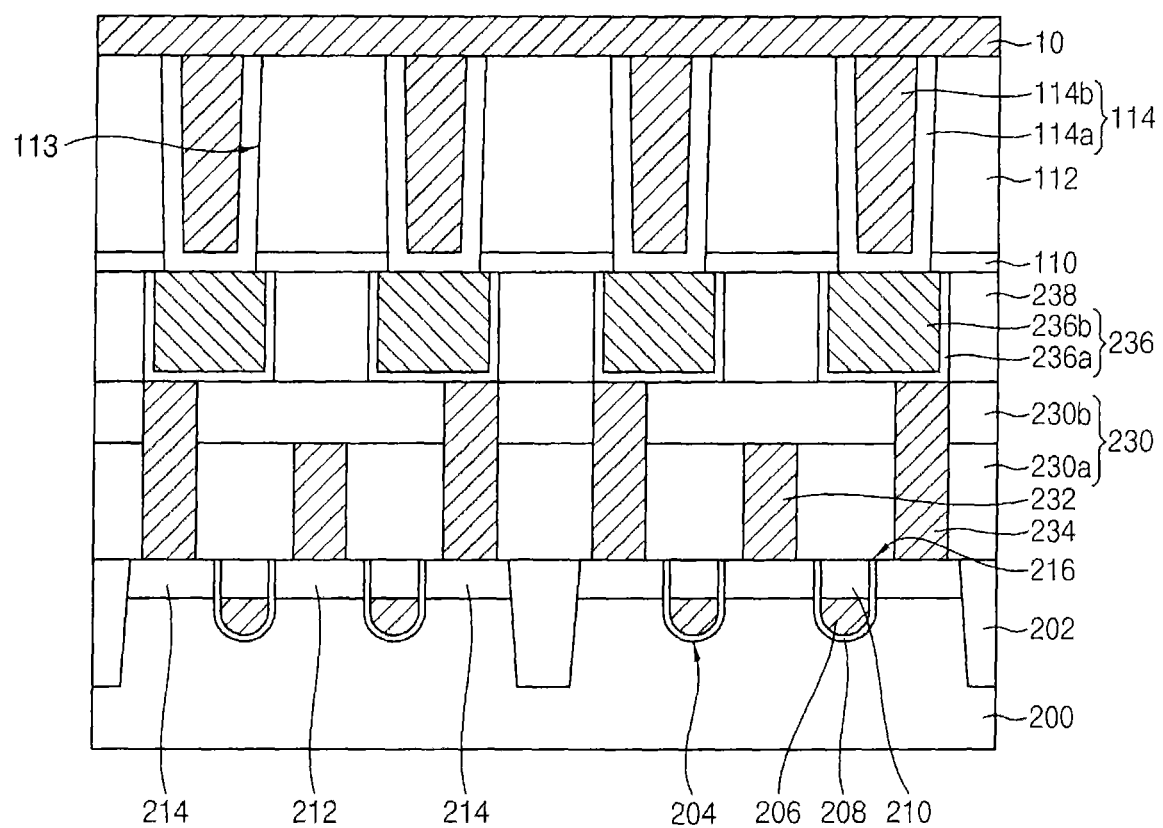

Referring to FIG. 18, a lower electrode layer 10 may be formed on the second insulating interlayer 112 and the lower electrode contact plug 114. The lower electrode layer 10 may include a metal and/or a metal nitride.

The lower electrode layer 10 may include a metal, e.g., tungsten, titanium, tantalum, etc., and/or a metal nitride, e.g., tungsten nitride, titanium nitride, tantalum nitride, etc.

Figure 19:
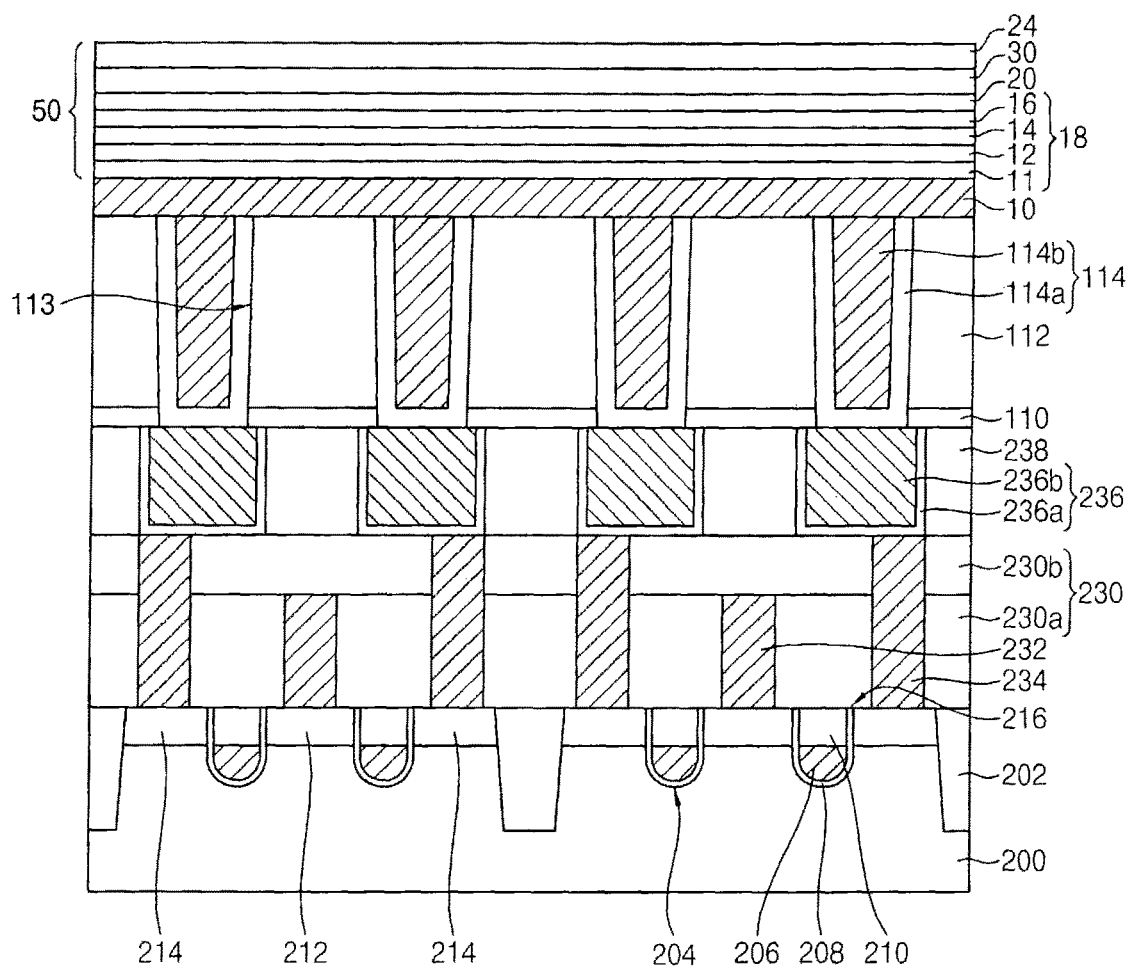

Referring to FIG. 19, an MTJ structure layer 50 may be formed on the lower electrode layer 10. The MTJ structure layer 50 may have substantially the same structure as that of FIG. 1 or FIG. 2. Hereinafter, as shown in FIG. 1, the MTJ structure layer 50 includes the seed layer 11, the first PL 12, the first spacer layer 14, the second PL 16, the polarization enhanced layer 20, the tunnel barrier structure 30, and the free layer (FL) 24 sequentially stacked.

The tunnel barrier structure 30 may have any of the structures of FIGS. 3 to 8. The tunnel barrier structure 30 may be formed by any of the methods illustrated with reference to FIGS. 11A to 11C, 12A to 12C, or 13A to 13C.

Thus, the tunnel barrier structure 30 may have a uniform resistivity distribution all over the locations of the substrate 200. Accordingly, the MRAM device including the tunnel barrier structure 30 may have uniform electrical characteristics.

Figure 20:
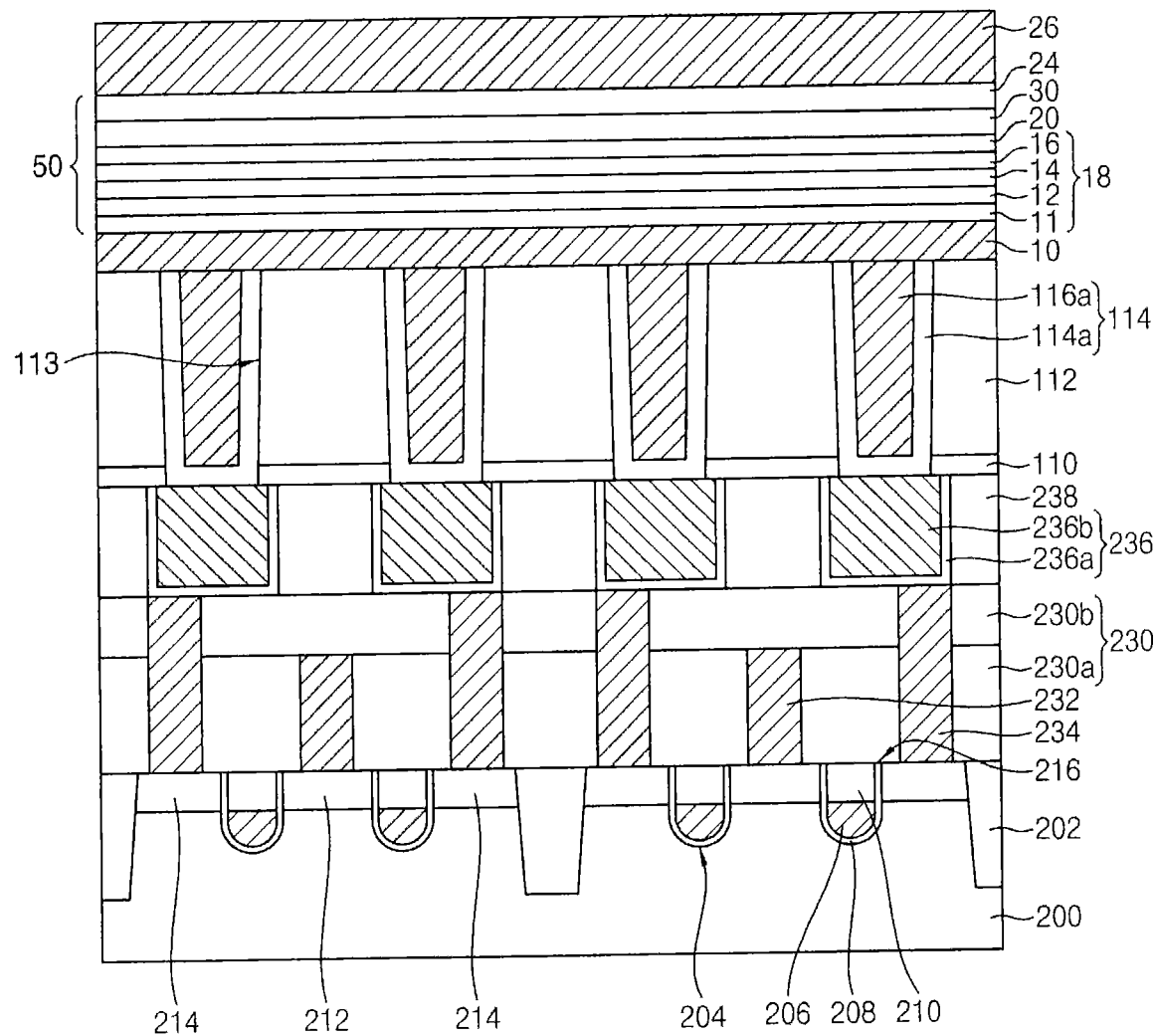

Referring to FIG. 20, an upper electrode layer 26 may be formed on the MTJ structure layer 50. The upper electrode layer 26 may include a metal and/or a metal nitride.

The upper electrode layer 26 may include a metal, e.g., tungsten, titanium, tantalum, etc., and/or a metal nitride, e.g., tungsten nitride, titanium nitride, tantalum nitride, etc.

Figure 21:
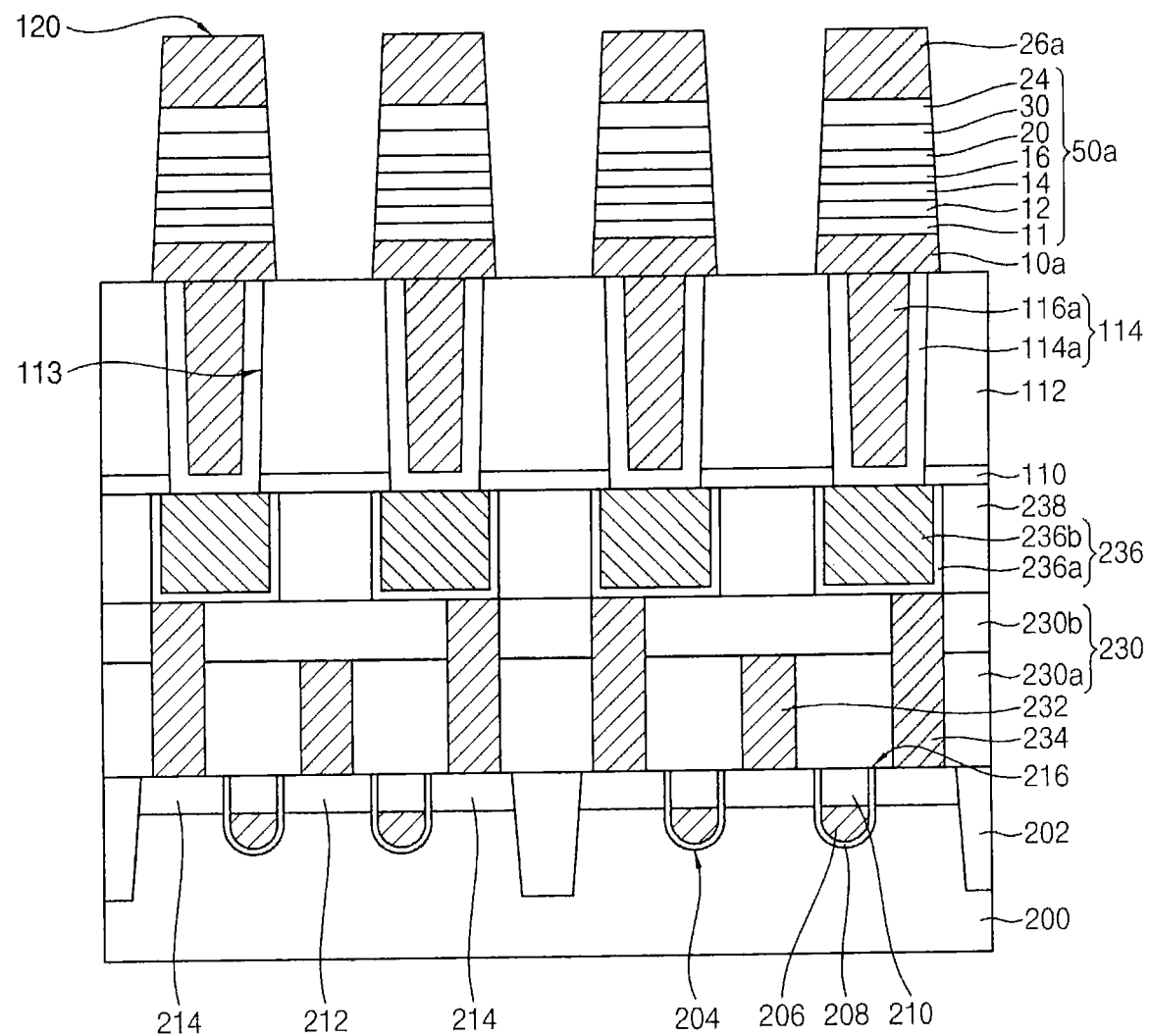

Referring to FIG. 21, the upper electrode layer 26 may be patterned to form an upper electrode 26a. The upper electrode 26a may overlap an upper surface of the lower electrode contact plug 114.

The MTJ structure layer 50 and the lower electrode layer 10 may be etched using the upper electrode 26a as an etching mask. The etching process may include, for example, a physical etching process. Accordingly, a variable resistivity structure 120 including a lower electrode 10a, an MTJ structure 50a and the upper electrode 26a that are sequentially stacked may be formed.

Figure 22:
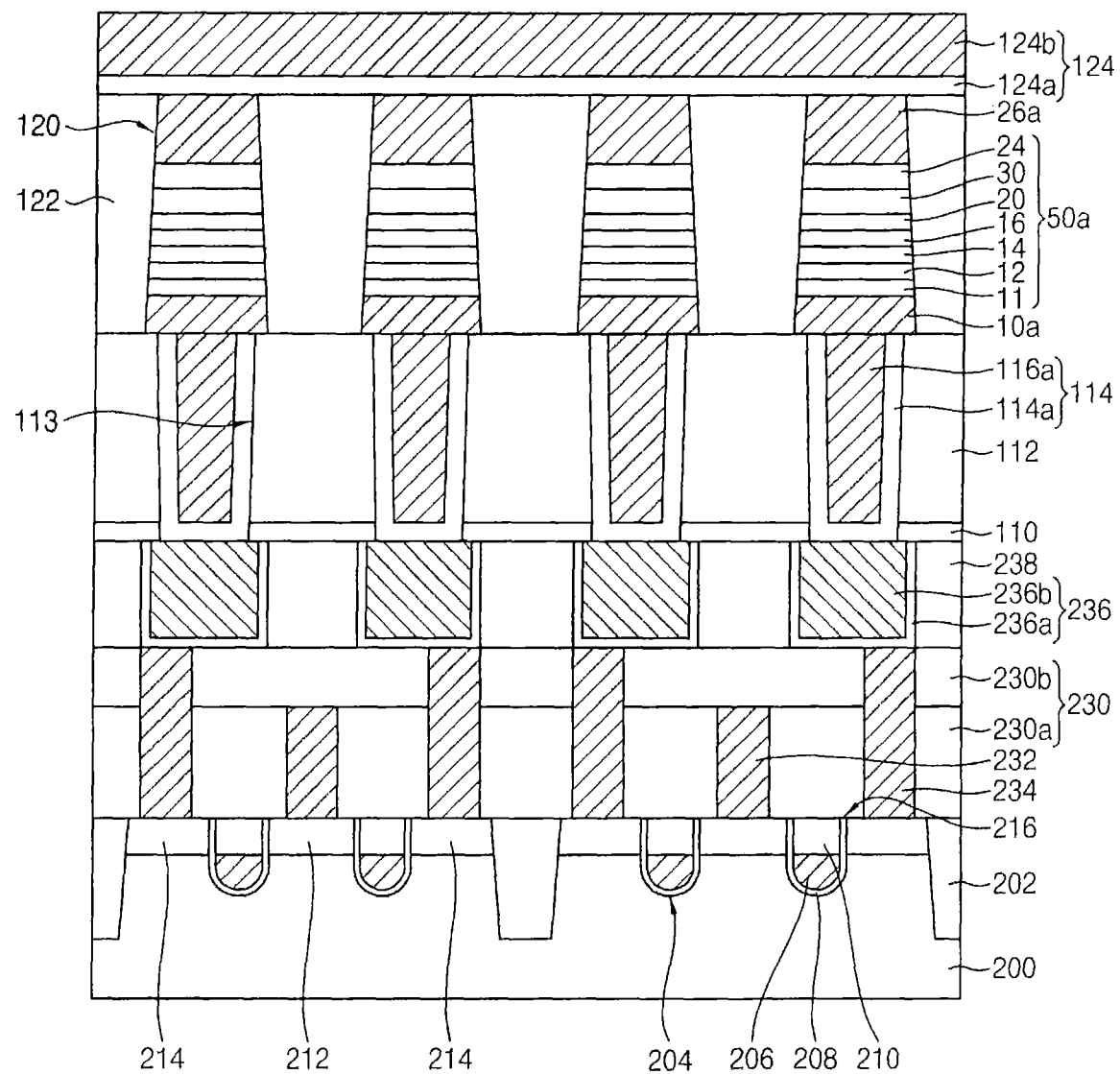

Referring to FIG. 22, a third insulating interlayer 122 may be formed on the second insulating interlayer 112. The third insulating interlayer 122 may include, e.g., silicon oxide. In some embodiments, a fourth insulating interlayer may be formed on the third insulating interlayer 122 and the variable resistivity structure 120.

A bit line 124 may be formed through the fourth insulating interlayer to contact an upper surface of the variable resistivity structure 120. The bit line 124 may extend in a second direction substantially perpendicular to the first direction to contact upper surfaces of a plurality of upper electrodes 26a. In example embodiments, a plurality of bit line 124 may be formed to be parallel to each other.

The bit line 124 may include a third barrier pattern 124a and a third conductive pattern 124b. The third barrier pattern 124a may include, e.g., titanium, titanium nitride, tantalum, tantalum nitride, etc. The third conductive pattern 124b may include, e.g., copper, tungsten, aluminum, etc.

An upper insulating interlayer may be further formed on the fourth insulating interlayer and the bit line 124.

By the above processes, the MRAM device including the transistor, the lower electrode contact plug 114, and the variable resistivity structure 120 may be formed. As illustrated above, the tunnel barrier structure of the MRAM device may have a uniform resistivity distribution. Accordingly, the MRAM device may have uniform electrical characteristics.

The MRAM device may serve as a memory device for mobile equipments, memory cards, computers, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing an MRAM device, the method comprising:
    forming a first electrode on an upper surface of a substrate;
    forming a first magnetic layer on the first electrode;
    forming a tunnel barrier structure on the first magnetic layer, the tunnel barrier structure comprising a first tunnel barrier layer and a second tunnel barrier layer that are sequentially stacked on the first magnetic layer and have different resistivity distributions from each other along a horizontal direction that is parallel to the upper surface of the substrate;
    forming a second magnetic layer on the tunnel barrier structure; and
    forming a second electrode on the second magnetic layer.

2. The method of claim 1, wherein both the first and second tunnel barrier layers comprise a metal oxide including a same metal element, and the first and second tunnel barrier layers are formed under different process conditions.

3. The method of claim 1, wherein each of the first and second tunnel barrier layers comprises magnesium oxide and/or aluminum oxide.

4. The method of claim 1, wherein the first and second tunnel barrier layers are formed by an RF sputtering process using a metal oxide as a target.

5. The method of claim 4, wherein, while forming the first tunnel barrier layer, the target and the substrate are spaced apart from each other by a first distance, and
    wherein, while forming the second tunnel barrier layer, the target and the substrate are spaced apart from each other by a second distance that is different from the first distance.

6. The method of claim 4, wherein, while forming the first and second tunnel barrier layers, portions of the substrate onto which a majority of oxygen negative ions generated from the target are provided are changed.

7. The method of claim 1, wherein the substrate comprises a central portion, an edge portion that is spaced apart from the central portion in the horizontal direction and an intermediate portion between the central portion and the edge portion,
    wherein the first tunnel barrier layer comprises a first central portion formed on the central portion of the substrate, a first intermediate portion formed on the intermediate portion of the substrate, and a first edge portion formed on the edge portion of the substrate,
    wherein the second tunnel barrier layer comprises a second central portion formed on the central portion of the substrate, a second intermediate portion formed on the intermediate portion of the substrate, and a second edge portion formed on the edge portion of the substrate,
    wherein the first tunnel barrier layer has a first resistivity distribution in which an average resistivity of the first central portion is lower than an average resistivity of the first intermediate portion, and
    wherein the second tunnel barrier layer has a second resistivity distribution in which an average resistivity of the second central portion is higher than an average resistivity of the second edge portion.

8. The method of claim 7, wherein forming the tunnel barrier structure comprises forming a plurality of first tunnel barrier layers comprising the first tunnel barrier layer and a plurality of second tunnel barrier layers comprising the second tunnel barrier layer, and the plurality of first tunnel barrier layers and the plurality of second tunnel barrier layers are stacked in an alternating sequence.

9. The method of claim 1, wherein the substrate comprises a central portion, an edge portion that is spaced apart from the central portion in the horizontal direction and an intermediate portion between the central portion and the edge portion,
    wherein the first tunnel barrier layer comprises a first central portion formed on the central portion of the substrate, a first intermediate portion formed on the intermediate portion of the substrate, and a first edge portion formed on the edge portion of the substrate,
    wherein the second tunnel barrier layer comprises a second central portion formed on the central portion of the substrate, a second intermediate portion formed on the intermediate portion of the substrate, and a second edge portion formed on the edge portion of the substrate,
    wherein the first tunnel barrier layer has a second resistivity distribution in which an average resistivity of the first central portion is higher than an average resistivity of the first edge portion, and
    wherein the second tunnel barrier layer has a third resistivity distribution in which an average resistivity of the second central portion is lower than an average resistivity of the second edge portion.

10. The method of claim 1, wherein the tunnel barrier structure further comprise a third tunnel barrier layer on the second tunnel barrier layer that extends between the first tunnel barrier layer and the third tunnel barrier layer,
    wherein the substrate comprises a central portion, an edge portion that is spaced apart from the central portion in the horizontal direction and an intermediate portion between the central portion and the edge portion,
    wherein the first tunnel barrier layer comprises a first central portion formed on the central portion of the substrate, a first intermediate portion formed on the intermediate portion of the substrate, and a first edge portion formed on the edge portion of the substrate,
    wherein the second tunnel barrier layer comprises a second central portion formed on the central portion of the substrate, a second intermediate portion formed on the intermediate portion of the substrate, and a second edge portion formed on the edge portion of the substrate,
    wherein the third tunnel barrier layer comprises a third central portion formed on the central portion of the substrate, a third intermediate portion formed on the intermediate portion of the substrate, and a third edge portion formed on the edge portion of the substrate, wherein the first tunnel barrier layer has a first resistivity distribution in which an average resistivity of the first central portion is lower than an average resistivity of the first intermediate portion, wherein the second tunnel barrier layer has a second resistivity distribution in which an average resistivity of the second central portion is higher than an average resistivity of the second edge portion, and wherein the third tunnel barrier layer has a third resistivity distribution in which an average resistivity of the third central portion is lower than an average resistivity of the third edge portion.

11. The method of claim 1, further comprising forming a metal layer between the first and second tunnel barrier layers.

12. The method of claim 11, wherein the first and second tunnel barrier layers and the metal layer are formed in-situ.

13. The method of claim 11, wherein the metal layer comprises aluminum, magnesium, titanium, tantalum, CoFeB, tungsten, hafnium, gold, silver, iridium, platinum, ruthenium, cobalt, and/or iron.

14. The method of claim 11, wherein the metal layer and the first and second tunnel barrier layers comprise a same metal element.

15. A method of manufacturing an MRAM device, the method comprising:

forming a first electrode on a substrate;

forming a first magnetic layer on the first electrode;

forming a tunnel barrier structure on the first magnetic layer by an RF sputtering process using a target, wherein the tunnel barrier structure comprises a first tunnel barrier layer and a second tunnel barrier layer that are sequentially stacked on the first magnetic layer, and wherein the substrate is spaced apart from the target by a first distance while forming the first tunnel barrier layer, the substrate is spaced apart from the target by a second distance while forming the second tunnel barrier layer, and the first distance is different from the second distance;

forming a second magnetic layer on the tunnel barrier structure; and forming a second electrode on the second magnetic layer.

16. The method of claim 15, wherein the target is a metal oxide target.

17. The method of claim 16, wherein the substrate comprises a first portion and a second portion that is different from the first portion, wherein a majority of oxygen negative ions that are generated from the target are provided onto the first portion of the substrate while forming the first tunnel barrier layer, and wherein a majority of oxygen negative ions that are generated from the target are provided onto the second portion of the substrate while forming the second tunnel barrier layer.

18. A method of manufacturing an MRAM device, the method comprising:

forming a first electrode on a substrate;

forming a first magnetic layer on the first electrode;

forming a first tunnel barrier layer on the first magnetic layer by a first sputtering deposition process using a first metal oxide target, wherein a majority of oxygen negative ions that are generated from the first metal oxide target are provided onto a first portion of the substrate;

forming a second tunnel barrier layer on the first tunnel barrier layer by a second sputtering deposition process using a second metal oxide target, wherein a majority of oxygen negative ions that are generated from the second metal oxide target are provided onto a second portion of the substrate, which is different from the first portion;

forming a second magnetic layer on the second tunnel barrier layer; and forming a second electrode on the second magnetic layer.

19. The method of claim 18, further comprising forming a metal layer on the first tunnel barrier layer and before forming the second tunnel barrier layer.

20. The method of claim 18, wherein forming the first and second tunnel barrier layers comprises forming a plurality of first tunnel barrier layers and a plurality of second tunnel barrier layers stacked in an alternating sequence.

* * * * *